(12) United States Patent
Brottier et al.

(10) Patent No.: US 11,139,408 B2
(45) Date of Patent: Oct. 5, 2021

(54) HYBRID SOLAR PANEL EQUIPPED WITH A DEVICE FOR FASTENING A HEAT EXCHANGER

(71) Applicant: DUALSUN, Marseilles (FR)

(72) Inventors: Laetitia Brottier, Marseilles (FR); Jérôme Mouterde, Marseilles (FR)

(73) Assignee: DUALSUN, Marseilles (FR)

( * ) Notice: Subject to any disclaimer, the term of this patent is extended or adjusted under 35 U.S.C. 154(b) by 463 days.

(21) Appl. No.: 16/087,808

(22) PCT Filed: Mar. 24, 2017

(86) PCT No.: PCT/FR2017/050686
§ 371 (c)(1),
(2) Date: Sep. 24, 2018

(87) PCT Pub. No.: WO2017/162993
PCT Pub. Date: Sep. 28, 2017

(65) Prior Publication Data
US 2020/0303577 A1 Sep. 24, 2020

(30) Foreign Application Priority Data
Mar. 24, 2016 (FR) ...................................... 1652532

(51) Int. Cl.
*H01L 31/0525* (2014.01)
*H02S 30/10* (2014.01)
*H02S 40/44* (2014.01)

(52) U.S. Cl.
CPC .......... *H01L 31/0525* (2013.01); *H02S 30/10* (2014.12); *H02S 40/44* (2014.12)

(58) Field of Classification Search
CPC ....... H01L 31/0525; H02S 30/10; H02S 40/44
See application file for complete search history.

(56) References Cited

U.S. PATENT DOCUMENTS

| 6,799,742 B2 * | 10/2004 | Nakamura | B64G 1/443 136/244 |
| 2010/0154888 A1 * | 6/2010 | Kadi | F24S 30/425 136/259 |
| 2015/0349178 A1 * | 12/2015 | Rubio | H02S 20/00 136/248 |

FOREIGN PATENT DOCUMENTS

CN 105141252 * 12/2015
DE 10 2011 107 393 A1 10/2012
(Continued)

OTHER PUBLICATIONS

Kroiß et al., Development of a seawater-proof hybrid photovoltaic/thermal (PV/T) solar collector, Science Direct, Energy Procedia, vol. /Issue 52, pp. 93-103 (Year: 2014).*

(Continued)

*Primary Examiner* — Jayne L Mershon
(74) *Attorney, Agent, or Firm* — Maier & Maier, PLLC

(57) ABSTRACT

Hybrid solar panel including a photovoltaic module having a front face and a rear face, a heat exchanger having a lower face and an upper face, said upper face being arranged facing the rear face of the photovoltaic module, a rigid frame surrounding the photovoltaic module and the heat exchanger, at least one elastic element adapted to exert a compression force against the lower face of the exchanger in such a way that the exchanger is thrust against the rear face of the photovoltaic module, the elastic element bears against at least one bearing element, and the bearing element being in connection with the frame in such a way that at least one portion of the compression force exerted by the elastic element on the bearing element is taken up by the frame.

23 Claims, 8 Drawing Sheets

(56) References Cited

FOREIGN PATENT DOCUMENTS

| DE | 102011107393 | * | 10/2012 |
|---|---|---|---|
| DE | 10 2011 122 126 A1 | | 6/2013 |
| FR | 1156550 A | | 5/1958 |
| FR | 2967817 A1 | | 5/2012 |
| WO | 2009/149572 A2 | | 12/2009 |
| WO | 2012/069750 A2 | | 5/2012 |

OTHER PUBLICATIONS

A. Kroiss et al., "Development of a Seawater-proof Hybrid Photovoltaic/thermal (PV/T) Solar Collector", Energy Procedia, 2014, p. 93-103, vol. 52; 11 pgs.

International Search Report with English translation and Written Opinion of the International Search Authority dated Jul. 19, 2017 of corresponding International application No. PCT/FR2017/050686; 12 pgs.

* cited by examiner

HYBRID SOLAR PANEL EQUIPPED WITH A DEVICE FOR FASTENING A HEAT EXCHANGER

FIELD

The invention has for object a hybrid solar panel provided with a device for fastening a heat exchanger.

It relates to the technical field of systems for assembling hybrid solar panels.

BACKGROUND

Photovoltaic solar panels make it possible to produce electrical energy from solar radiation. They comprise a plurality of photovoltaic elements (cells or thin layers) that operate according to the principle of the photoelectric effect. Generally, several photovoltaic elements are connected together on a photovoltaic solar panel, and several panels are connected in order to create a solar installation. This installation produces electricity that can be consumed on site or feed a distribution network.

Photovoltaic solar panels convert only a small part of the solar radiation into electricity, the rest being unused heat. This heat is unfavorable for the electrical performance of solar panels since it is possible to observe a decrease in the efficiency of photovoltaic elements with the temperature of about $-0.45\%/^\circ$ C. That is why it is duly interesting to cool photovoltaic solar panels. Indeed, not only the efficiency of the photovoltaic elements increases, but the calories of the cooling can be used in more or less complex heating systems. These are then referred to as hybrid solar panels that can simultaneously produce electrical energy and thermal energy.

Generally, a heat exchanger is arranged facing the rear face of the photovoltaic module in such a way as to cool the latter. Patent document WO 2012/069750 (SOLAIRE 2G) proposes a hybrid solar panel comprised of a heat exchanger in contact with the photovoltaic elements. Generally the heat exchanger is fixed to the photovoltaic module thanks to various methods such as gluing or direct lamination (lamination being a typical method known in the field of photovoltaics).

Such methods make it possible, in addition to attaching the exchanger to the photovoltaic module, to prevent the presence of air and as such improve the thermal performance. However, these techniques have as disadvantages of requiring a substantial thickness of adhesive (or of polymer).

Various techniques make it possible to overcome the deformations generated by the expansion of the various ports of the panel during the use thereof:
  adhesives making it possible to attach an exchanger manufactured in a material of which the expansion coefficient is far from that of the front face of the photovoltaic module (such as for example copper, aluminum or a polymer material) have been developed. However, these adhesives are extremely expensive and substantially increase the price of manufacturing the hybrid solar panel;
  patent document FR 1156550 (SOLAIRE 2G) proposes the use of less expensive adhesives. However, the latter are only effective for gluing two materials that have close expansion coefficients;
  patent document WO 2009149572 (IDS HOLDING AG) proposes a panel wherein the exchanger is in pieces in order to limit the expansion between the glass and the aluminum. Such a panel is however extremely complicated to manufacture and install.

All of the aforementioned techniques have disadvantages such as the very high cost price, the difficulty in implementation, or the limitation in the type of material that can be used. Patent document DE 10 2011 122 126 (PA-ID AUTOMATION & VERMARKTUNG GMBH) proposes a device that overcomes some of these disadvantages. It proposes a solar panel comprising:
  a photovoltaic module,
  a heat exchanger arranged against the photovoltaic module,
  a rigid frame surrounding the photovoltaic module and the exchanger,
  and two elastic elements directly engaged with the frame and adapted to exert a compression force against the exchanger in such a way as to press it against the photovoltaic module.

However, the pressing obtained thanks to such a device is not uniform over the entire surface of the exchanger since it comprises only two elastic elements exerting a compression force in very precise segments. The output of such a hybrid solar panel is therefore not optimal. Furthermore, if the heat exchanger is pressed against the photovoltaic module, it can however be displaced longitudinally and laterally inside the frame, said displacement can result in a deterioration of the hydraulic connectors which risk being pulling off or disconnected from the exchanger. The reliability of such a solar panel can therefore be doubtful when it is being handled.

A hybrid solar panel is described in the article, A. KROISS AND AL: *"Development of a seawater-proof Hybrid Photovoltaic/thermal (PV/T) Solar Collector"*, ENERGY PROCEDIA, vol. 52; Jan. 1, 2014 (2014-01-01), pages 93-103. This hybrid solar panel is comprised of a photovoltaic module against which an exchanger is pressed. In order to press the exchanger, bars against which springs are pressing are used. The bars are fixed on the rear face of a rigid frame thanks to a screw system. The design of this solar panel however appears to be relatively complex and the aforementioned problems of displacement of the exchanger inside the frame persistent.

Other similar solar panels are described in patent documents DE 10 2011 107393 (SOLVIS) and U.S. 2015/349178 (RUBIO), the issue linked to the displacement of the exchanger however not being suitable resolved.

The invention aims to overcome this situation. In particular, an objective of the invention is to propose a hybrid solar panel of which the design makes it particularly reliable, in particular when it is being handled.

Another objective of the invention is to improve the uniformity of the pressing of the heat exchanger against the photovoltaic module.

Yet another objective of the invention is to improve the thermal exchange between the photovoltaic module and the heat exchanger.

Yet another objective of the invention is to obtain an effective hybrid solar panel of which the manufacturing costs are limited.

An additional objective of the invention is to obtain a robust hybrid solar panel of which the design is simplified and of which the aesthetics is improved.

Another objective of the invention is to obtain a hybrid solar panel that can use materials with expansion coefficients that have distant values.

SUMMARY

The solution proposed by the invention is a hybrid solar panel comprising:

a photovoltaic module comprising a front face and a rear face, a heat exchanger comprising a lower face and upper face, said upper face being arranged facing the rear face of the photovoltaic module, a rigid frame surrounding the photovoltaic module and the heat exchanger, at least one elastic element adapted to exert a compression force against the lower face of the exchanger in such a way that said exchanger is thrust against the rear face of the photovoltaic module, the elastic element bears against at least one bearing element, said bearing element being in connection with the frame in such a way that at least one portion of the compression force exerted by the elastic element on the bearing element is taken up by said frame, the bearing element is arranged under the exchanger and extends in the width and/or the length of said exchanger.

The invention is remarkable in that:

at least one blocking element is fixed to the exchanger, the blocking element interacts with the bearing element, in such a way as to block the exchanger in translation in the direction of the length and in the direction of the width of the panel, preventing the sliding of said exchanger under its own weight, inside the frame.

The exchanger is now perfectly maintained in position inside the frame in such a way that the hydraulic connectors are further preserved, which makes the panel more reliable.

Furthermore, the specific design of the panel makes it possible to obtain a more uniform pressing of the exchanger against the photovoltaic module. The compression forces of the various elastic elements being applied over the entire surface of said exchanger and not in localized segments as in the aforementioned patent document DE 10 2011 122 126 (PA-ID AUTOMATION & VERMARKTUNG GMBH).

Other advantageous characteristics of the invention are listed hereinbelow. Each one of these characteristics can be considered individually or in combination with the remarkable characteristics defined hereinabove, and be the object, where applicable, of one or several divisional patent applications:

the blocking element is advantageously positioned at the center of the lower face of the exchanger;

the frame preferably has a lower face adapted for being positioned against a fastening support of the panel, the bearing element being configured in such a way that when said bearing element is stressed by the elastic element, it does not exceed the plane containing the lower face of said frame;

the hybrid solar panel can comprise at least three support elements arranged under the exchanger and which each extend in the width of said exchanger, said support elements having the form of profiles installed at regular intervals in the length of said exchanger;

the hybrid solar panel can comprise at least three support elements arranged under the exchanger and which each extend in the length of said exchanger, said support elements having the form of profiles installed at regular intervals in the width of said exchanger;

several elastic elements can be distributed in the length of each profile;

the elastic profiles can be distributed in each one of the profiles in such a way that said elastic elements are arranged staggered in considering all of said profiles;

the bearing element can have the form of a U-shaped profile delimited by a bottom wall and two lateral branches, said branches define an opening on their free end, said profile is arranged in such a way that said opening is directed towards the lower face of the exchanger, the elastic element bearing against the bottom wall of said profile;

the bearing element can have the form of a plate arranged under the exchanger and which extends over the entire surface of the lower face of said exchanger;

the bearing element can have the form of a plate with a honeycomb structure;

several elastic elements can be distributed homogeneously over the entire surface of the lower face of the exchanger;

the elastic profiles can be arranged staggered;

the elastic element can have the form of a helical compression spring;

the hybrid solar panel can include a corrugated plate installed between the bearing element and the lower face of the exchanger, said corrugated plate being configured in such a way that its corrugations form the elastic profiles;

the elastic element can be made of plastic, or galvanized steel, or stainless steel;

the elastic element can comprise a front end and a rear end, a means of protection being placed between the lower face of the exchanger and said front end;

the means of protection can have the form of a rigid plate installed between the lower face of the exchanger and the front end of the elastic element, in the form of a cup placed between the lower face of the exchanger and the front end of the elastic element, or in the form of a element made of foam placed between the lower face of the exchanger and the front end of the elastic element;

a maintaining element can be placed between the rear end of the elastic element and the bearing element;

the maintaining element can be an adhesive element;

a thermally insulating element can be inserted between the support elements.

BRIEF DESCRIPTION OF THE FIGURES

Other advantages and characteristics of the invention shall appear better when reading the following description of a preferred embodiment, in reference to the accompany drawings, provided for the purposes of information and in no way limiting and wherein.

DETAILED DESCRIPTION

The solar panel P objet of the invention is a hybrid solar panel known from prior art, i.e. it is capable of simultaneously producing electrical energy and thermal energy. It is intended to be used alone or in combination with other similar panels, in such a way that the electrical and thermal energy that it produces can be used by a housing unit or an installation.

Figure 1:
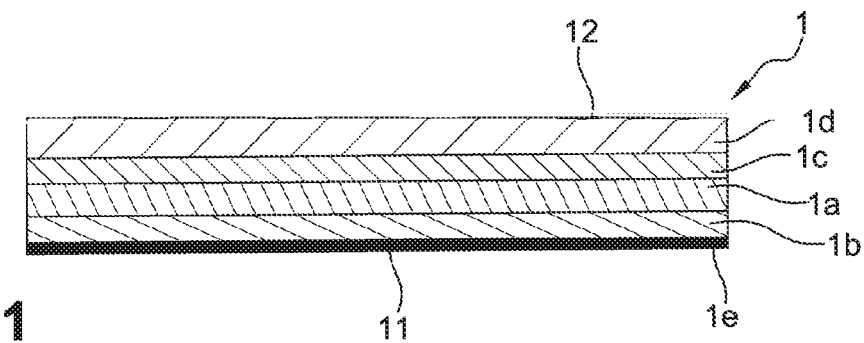
FIG. 1 diagrammatically shows as a cross-section various layers forming the photovoltaic module.

In reference to the accompanying figures and in particular to FIG. 1, the solar panel P comprises a photovoltaic module 1 having a front face 12 and a rear face 11. The front face 12 is left free in such a way that it can receive the solar radiation. Approximately 80% of the solar energy received is dissipated in the panel P. The presence of a heat exchanger 2 placed facing the rear face 11 of the photovoltaic module 1 makes it possible to recover the heat accumulated or dissipated in the photovoltaic module 1.

In FIG. 1, the photovoltaic module 1 comprises at least one, and advantageously several photovoltaic elements 1*a* placed in the same plane. The latter are connected electrically together, in series or in parallel, and are encapsulated, for example in a thermoplastic polymer 1*b*, 1*c* such as ethylene vinyl acetate (EVA) or silicone, in order to form the photovoltaic module 1. The front face 12 of the photovoltaic module 1 exposed to the radiation is advantageously covered with a transparent plate 1*d*, such as for example a glass plate.

A layer of electrically insulating material 1*e* called a "backsheet" is added on the rear face 11 of the photovoltaic module 1. This layer 1*e* provides, in addition to the electrical insulation, a sealing function between the photovoltaic module 1 and the heat exchanger 2. This layer 1*e* can, for example, be a polyvinyl fluoride film, and makes it possible to prevent rain and/or moisture in the ambient air from coming into direct contact with the photovoltaic module 1, as such preventing any electrical problem, such as for example poor contacts or short circuits.

These various elements 1*a*, 1*b*, 1*c*, 1*d*, 1*e* are stacked in the form of a sandwich and are maintained together by a hot lamination method known in the field of photovoltaics.

Figure 3A:
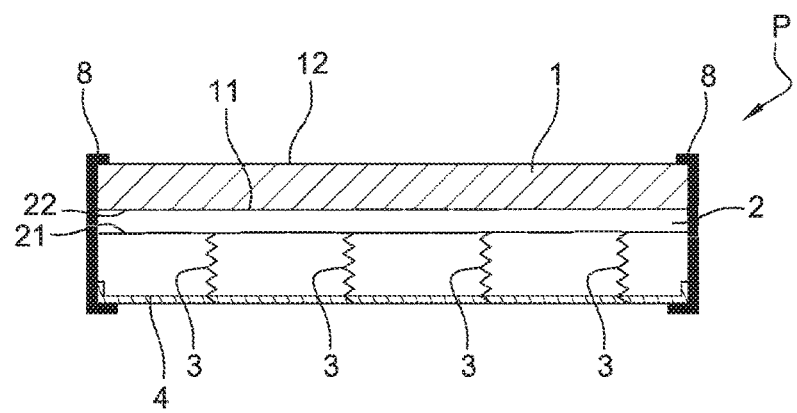
FIG. 3a is a cross-section view along B-B of the hybrid solar panel of the FIG. 2.
Figure 3B:
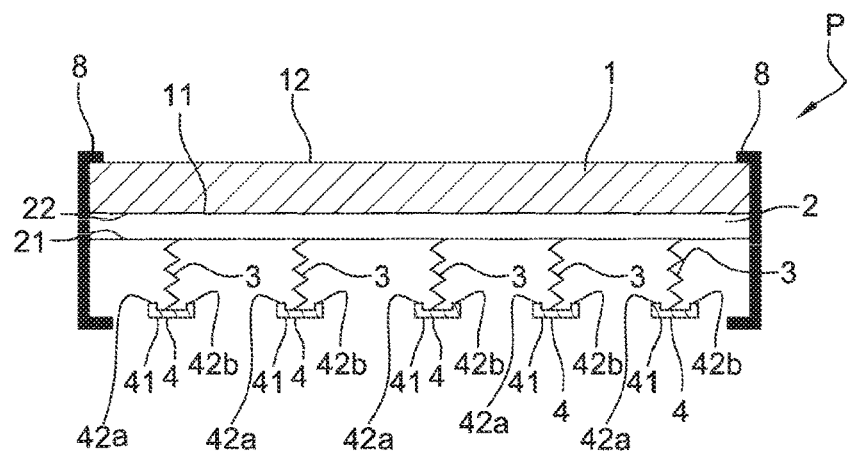
FIG. 3b is a cross-section view along A-A of the hybrid solar panel of the FIG. 2.

In the FIGS. 3*a* and 3*b*, the exchanger 2 is located under the photovoltaic module 1 in such a way as to not obstruct the solar radiation. The heat exchanger 2 is advantageously made from a plastic material, preferably polypropylene, but it can be made from polyethylene, polymethyl methacrylate, polyphenylene sulfide, polyphenylene oxide, polyphenylene ether, acrylonitrile butadiene styrene, or any other material that is suitable for those skilled in the art. It can also be manufactured from other types of material such as copper or aluminum. These materials make it possible to sustainably resist the corrosion generated by the coolant, as well as temperatures that can reach up to 90° C. The exchanger 2 can also be comprised of a loaded polymer, such as for example with glass fibers, as such making it possible to improve the rigidity thereof.

The coolant, which is typically water, or glycol water, circulates in the heat exchanger 2 in order to recover the calories coming from the photovoltaic module 1. It always circulated in the exchanger 2 from an inlet zone to an outlet zone. This type of exchanger 2 is for example described in patent document FR 2967817 (SOLAIRE 2G) to which those skilled in the art can refer.

The exchanger 2 is comprised of an upper face 22 plane intended to be in contact with the rear face 11 of the photovoltaic module 1 and with a lower face 21. The upper 22 and lower 21 faces are preferably flat and parallel to one another. The surface of the lower face 21 represents for example between 10% and 100% of the total surface of the photovoltaic module 1. It can, for example, have dimensions (length and width) that correspond to those of the photovoltaic module 1, both being of a general rectangular shape.

It has a length that can be between 150 cm and 400 cm, a width varying from 50 cm to 300 cm, and a thickness varying from 1 mm to 2 cm. Preferably, for a temperature of 20° C., the length of the exchanger 2 represents 85% of the length of the photovoltaic module 1 and 95% of its width.

The panel P comprises a frame 8 which is preferably made from aluminum or polymer, and can, for example, be formed from U-shaped profiles assembled together by using different assembly techniques, such as for example, by welding or screwing. The U-shaped profiles can also be assembled to one another by embedding each one of their corners inside one another. In this way, the profiles are integral with one another without requiring additional assembly elements.

In relation to the accompanying figures showing the frame 8 as a cross-section, in particular FIGS. 3*a* and 3*b*, the U-shaped profiles forming said frame having a core 8*a*. Said core 8*a* is provided at each one of its ends with a wing 8*b*, 8*c*.

The photovoltaic module 1 is inserted into the frame 8, on upper wings 8*b*. The maintaining in position of the photovoltaic module 1 in the frame 8 can be carried out by any means suitable for those skilled in the art, in particular by screwing or gluing, or by providing a dedicated groove in the cores 8*a* wherein said module is housed.

In accordance with the invention, a device makes it possible to stress the exchanger 2 against the rear face 11 of the photovoltaic module 1. This device has the form of a combination of means (described hereinabove in the description) comprising one or several support elements 4 combined with elastic elements 3 bearing against said support elements 4. This combination of means makes it possible to effectively and uniformly press the exchanger 2 against the photovoltaic module 1. The presence of the elastic elements 3 makes it possible to improve the performance of the hybrid solar panel P by effectively damping the tolerances on the dimensions of the frame 8 as well as those of the support elements 4. They also make it possible to dampen the possible sagging of the various types of support elements 4.

Example embodiments of the stressing device shall now be described.

Embodiment No. 1

Figure 2:
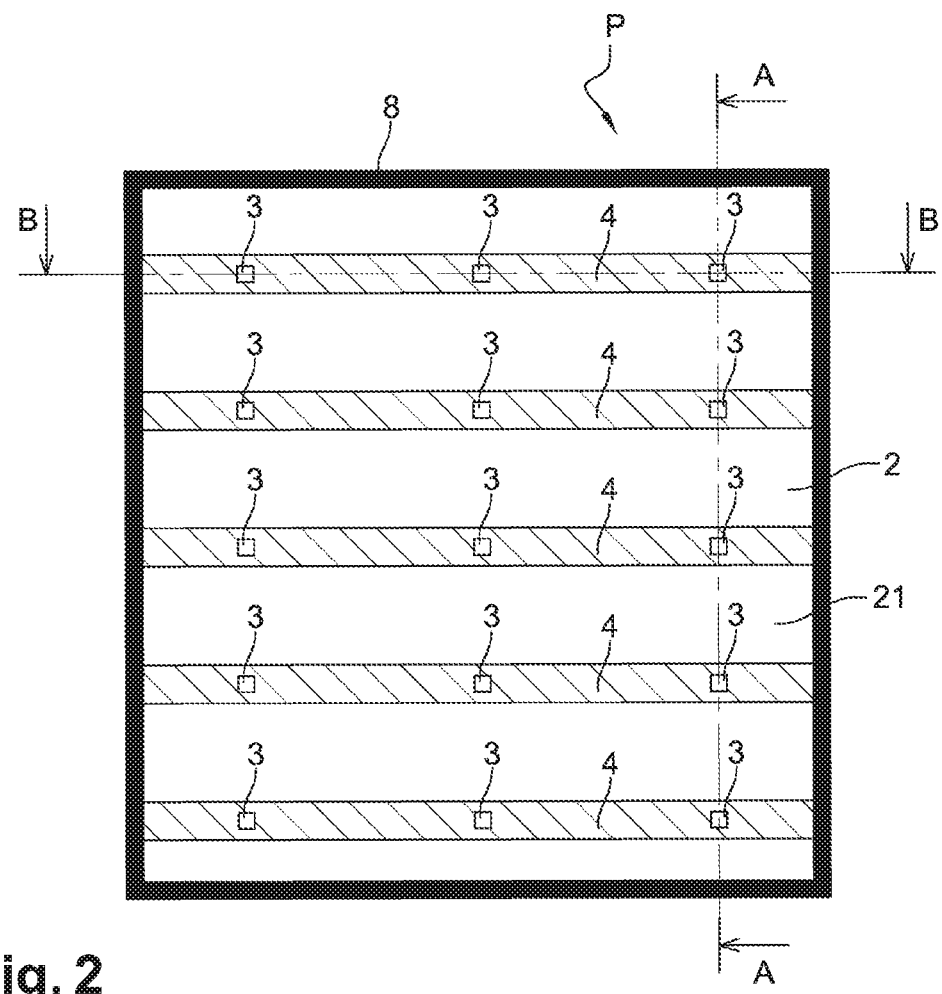
FIG. 2 is a diagrammatical view of the bottom of a hybrid solar panel in accordance with the invention, the support elements having the form of profiles.

In a first embodiment shown in FIGS. 2, 3*a* and 3*b*, the hybrid solar panel P comprises several support elements 4 having the form of profiles. The panel P comprises at least three profiles 4 but can have more. These profiles 4 are placed under the exchanger 2, facing its lower face 21, and are distributed over the entire surface thereof. Preferably, they are installed at regular intervals, either over the entire length of the exchanger 2, or over the entire width thereof. Such an arrangement allows for a better distribution of the compression forces applied by each one of the elastic elements 3, a more uniform pressing of the exchanger 2 against the rear face 11 of the photovoltaic module 1 being as such obtained.

The number of profiles 4 is chosen according to the desired performance of the hybrid solar panel P as well as of the boom of the exchanger 2. Indeed, the more the material wherein is manufactured the exchanger 2 is flexible, the more substantial the deformations are and the higher the number of elastic elements 3 required is. The number of profiles 4 being, consequently, also more substantial, the intervals described hereinabove will be reduced. They can, for example, be between 10 cm and 100 cm, preferably equal to 30 cm. The profiles 4 are installed in such a way as to be maintained in place by the frame 8. As such each one of the ends of the profiles 4 is slid into the frame 8. In order to prevent the profiles 4 from being dislodged from the frame 8, fastening means such as glue, screws, or adhesives can be used. In the FIGS. 3*a* and 3*b*, the profiles 4 are inserted into the frame 8, on lower wings 8*a*, and bear against the latter. As such, all or a portion of the compression force exerted by the elastic profiles 3 on the support elements 4 is taken up by the frame 8 on lower wings 8*a*.

The profiles 4 advantageously have the form of bars with a square or rectangular section, or in the shape of an H, and having a length varying from 50 cm to 400 cm. Their width is between 1 cm and 10 cm, and their thickness varies from 2 mm to 5 cm. The thickness of the profiles 4 is chosen according to the force of the elastic elements 3 used (described hereinabove in the description). Indeed, the sagging of the profiles 4 under stress (after installation of the elastic elements 3) must not exceed the return (or lower face) of the frame 8. In this way, the lowest point of each one of the profiles 4 is not lower than the return of the frame 8. In other terms, and in reference for example to FIGS. 3*a* and 3*b*, when the profiles 4 are stressed and are sagging, said profiles do not exceed the frame 8 and in particular do not exceed the plane 80 containing the lower face of said frame. As such, the lower face of the frame 8 can be suitably fixed on a standard fastening support during the installation of the panel P, and in particular on a support plane. Indeed, when the profiles 4 do not exceed the plane 80, the entire lower face of the frame 8 is correctly positioned bearing against the fastening support, without one-off contact. For example, the configuration (in particular the section and/or the modulus of elasticity) of the profiles 4 makes it possible to limit the sagging of said profiles. Note that the solar panels described in the aforementioned article A. KROISS AND AL and U.S. Patent 2015/349178, the profiles against which the elastic profiles bear are located outside of the frame in such a way that the latter cannot be suitable fastened onto standard fastening supports.

In FIG. 3*b*, the profiles 4 preferably have the form of U-shaped profiles comprising a bottom wall 41 and two lateral branches 42*a*, 42*b*. The two branches 42*a*, 42*b* define an opening being placed facing the lower face 21 of the exchanger 2 during the design of the solar panel P. This opening makes it possible to insert the elastic profiles 3 so that they bear against the wall of the bottom 41. This type of profiles contributes to providing the maintaining in position of the elastic elements 3 and in concealing them in such a way as to improve the aesthetics of the panel P and protect them from potential handling errors.

The elastic elements 3 preferably have the form of helical compression springs comprising a front end 32 and a rear end 31. They can however have other forms that have the same function, such as for example spring blades or any other element suitable for exerting a compression force on the exchanger 2. These springs 3 are preferably made of stainless steel in order to prevent the corrosion thereof and increase their service life. They can also be manufactured by using any other metal, and can comprise a galvanized coating or not. The springs 3 can also be made of plastic in such a way as to prevent any heat loss between the exchanger 2 and said springs 3. The springs 3 made of plastic also make it possible to prevent any damage of the lower face 21 of the exchanger 2. The springs 3 have a height between 5 mm and 5 cm. They have a compression force comprise, between 5 N and 70 N, preferably between 8 N and 12 N. According to the performance desired for the hybrid solar panel P, a certain tolerance concerning the sagging is authorized. This characteristic determines both the number of springs 3 used (as described above) and the force thereof. The springs 3 chosen can all have the same force, but they can also have difference forces. The force of the springs 3 placed in the inlet and outlet zones of the coolant, can for example, have a force greater than that of the springs 3 placed at the center of the exchanger 2.

As shown in FIGS. 3*a* and 3*b*, the springs 3 are positioned in such a way that their rear end 31 is bearing against the profiles 4 and their front end 32 exerts a compression force on the lower face 21 of the exchanger 2. Several springs 3 are distributed in the length of each one of the profiles 4 (FIG. 2), the number of springs 3 per profile 4 able to vary from 2 to 15. During the use of the panel P, the exchanger 2 undergoes deformations due to the changes in temperature, in particular at the level of its length and its width. The presence of springs 3 between the exchanger 2 and the bearing element 4 make possible the deformations due to any expansion of the exchanger 2, while maintaining it pressed against the photovoltaic module 1. In addition, as the bearing element 4 is maintained in place by the frame 8, when the springs 3 exert a compression force on said bearing element 4, at least one portion of this force is taken up by said frame 8. As such, the compression force is transmitted to each one of the ends of the profile 4, the latter being consequently, taken up by the frame 8 wherein said ends are slid.

By using U-shaped profiles 4, the rear end 31 of the springs 3 is housed against the bottom wall 41 and between the two branches 42*a*, 42*b*. This configuration makes it possible to both protect the springs 3 and to improve the aesthetics of the panel P, and to prevent an undesired lateral displacement of the springs 3 during the use of the solar panel P.

Figure 4A:
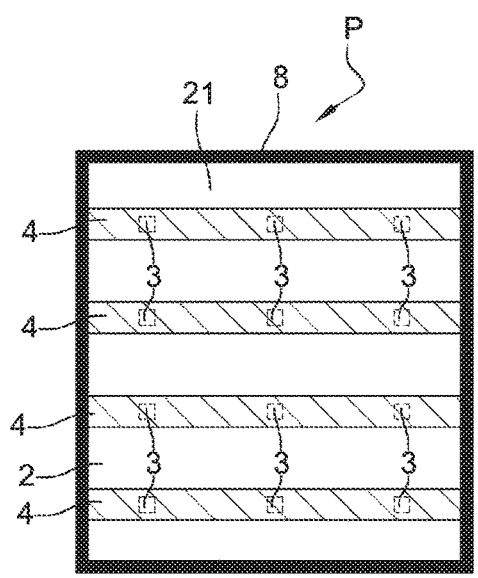
FIG. 4a is an alternative of the panel of FIG. 2.
Figure 4B:
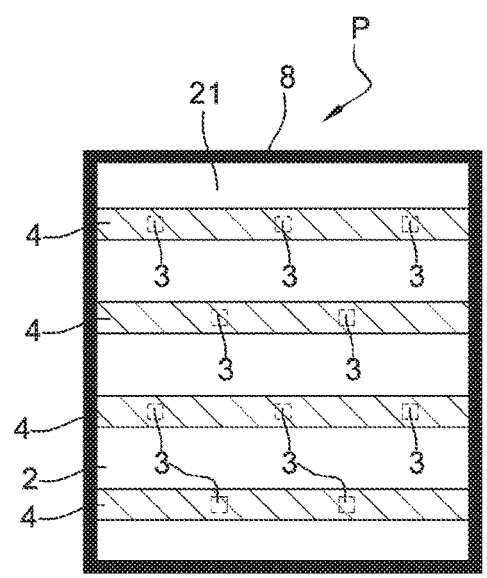
FIG. 4b is an alternative of the panel of FIG. 2.

The springs 3 can be distributed at the rear of the panel P in such a way that they are all aligned (FIG. 4*a*), i.e. arranged in lines and in columns. However, the springs 3 can be arranged in an offset manner from one profile to the other (FIG. 4b) in such a way that in considering all of said springs 3, they latter are arranged staggered. This configuration contributes to reducing the sag of the exchanger 2 under the effect of the compression forces of the springs 3, and consequently improves the homogeneity of the pressing of said exchanger 2 against the photovoltaic module 1.

The solar panel P comprises at least one blocking element 5 fixed to the exchanger 2 and in interaction with a profile 4 in order to block the exchanger 2 in translation in the direction of the length (longitudinal axis X) and of the width (transversal axis Y) of the panel P. Preferably, the blocking element 5 is fixed to the exchanger 2 on the center of its lower face 21. This configuration makes it possible to prevent any risk of sliding of the exchanger 2 under its own weight, inside the frame 8, during the handling of the panel P (during steps such as for example the packaging, transport, or installation).

Figure 9:
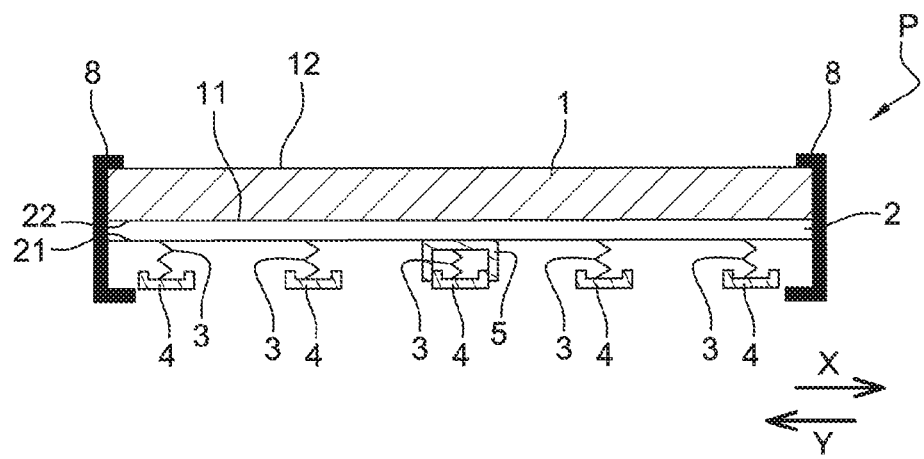
FIG. 9 is a diagrammatical view as a cross-section of an alternative of the hybrid solar panel of the invention, a means for blocking being installed on the exchanger.
Figure 10:
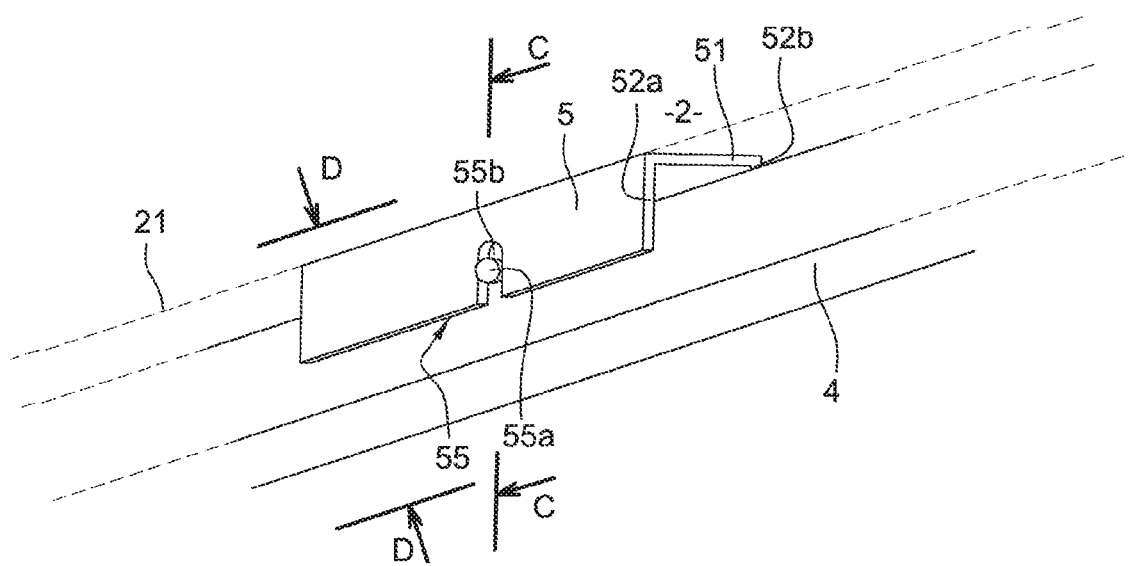
FIG. 10 is an enlarged view of the means for blocking of FIG. 9.
Figure 11:
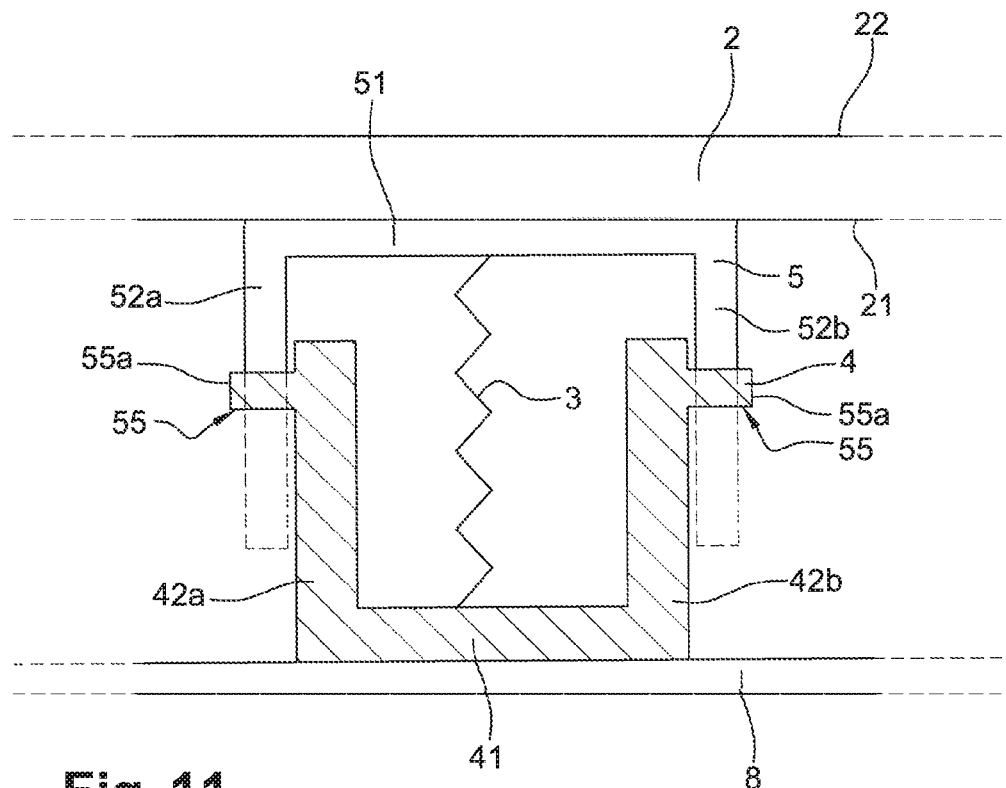
FIG. 11 is a cross-section view along C-C of the means for blocking of FIG. 10.

The FIGS. 9, 10, and 11 show an example of such a blocking element 5. The latter has the form of a U-shaped profile comprising a bottom wall 51 and two lateral walls 52a, 52b. The bottom wall 51 is fastened on the lower face 21 of the exchanger 2 using fastening techniques such as welding, or gluing. One of the profiles 4 is slid between the walls 52a, 52b, as such making it possible to block the exchanger 2 in translation (according to the directions X and/or Y). Such a configuration prevents the exchanger 2 from being displaced and results in a deterioration of the hydraulic connectors located at its ends. In addition, by placing the means for blocking 5 t the center of the lower face 21 of the exchanger 2, a symmetric expansion (due to the increase in temperature of the photovoltaic module 1 in the presence of solar radiation during the day and to its cooling at ambient temperature during the night) of the exchanger 2 is made possible. As such, during the use of the panel P, instead of having an expansion of x mm of a single side of the exchanger 2 (in the width and in the length), an expansion of x/2 mm on each one of the sides is observed.

In FIGS. 10 and 11, the stressing device comprises an assembly 55 that makes it possible to further secure the profile 4 in position during the design of the panel P. This assembly 55 comprises a male element 55a located on the profile 4 that cooperates with a female element 55b placed on the blocking element 5. In particular, at least one, preferably both branches 42a, 42b of the profile 4, comprises a male element 55a that has the form of a mug protruding outwards from the U. In parallel, the blocking element 5 comprises a corresponding groove 55b wherein is housed the lug 55a.

Figure 15:
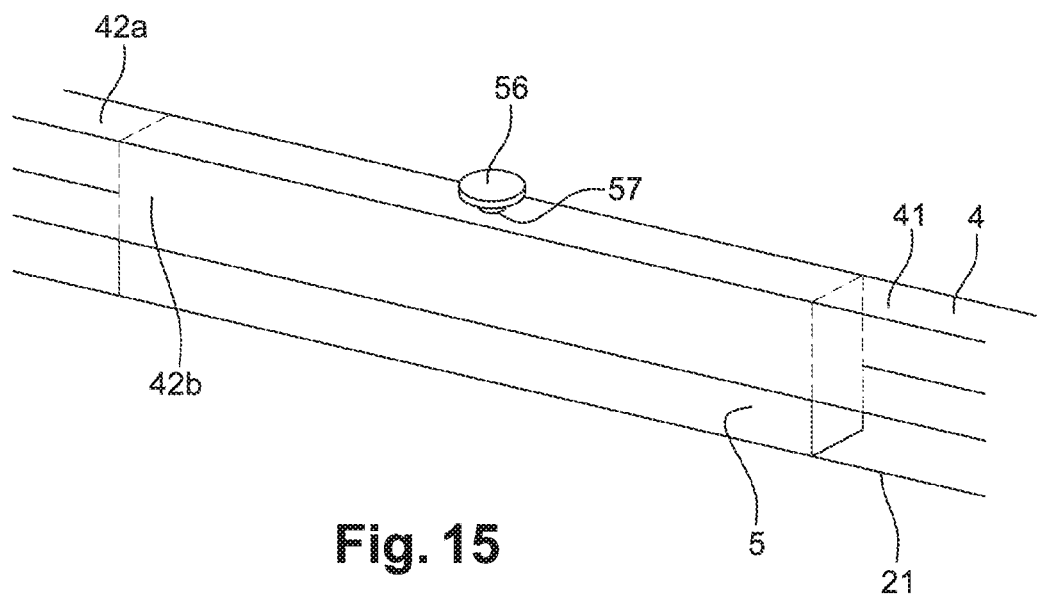
FIG. 15 is an alternative of the means for blocking of FIG. 10.

In an alternative embodiment shown in FIG. 15, the blocking element 5 is a slab of rectangular section that slides into the profile 4. This slab has a length varying from 2 cm to 5 cm and a width corresponding to that of the profile 4 (between 1 cm and 10 cm). A fastening element 56 such as for example a pin, or a nail (for example a fluted nail made of stainless steel) is inserted into an orifice 57 carried out in the profile 4 and being placed in the alignment of an orifice (not shown) made in the slab 5. The fastening element 56 is integral with the lower face 21 of the exchanger 2. This configuration prevents the slab 5 (and therefore the exchanger 2) from moving in translation along said profile 4, while the branches 42a, 42b of the U prevent it from moving transversally.

Figure 12:
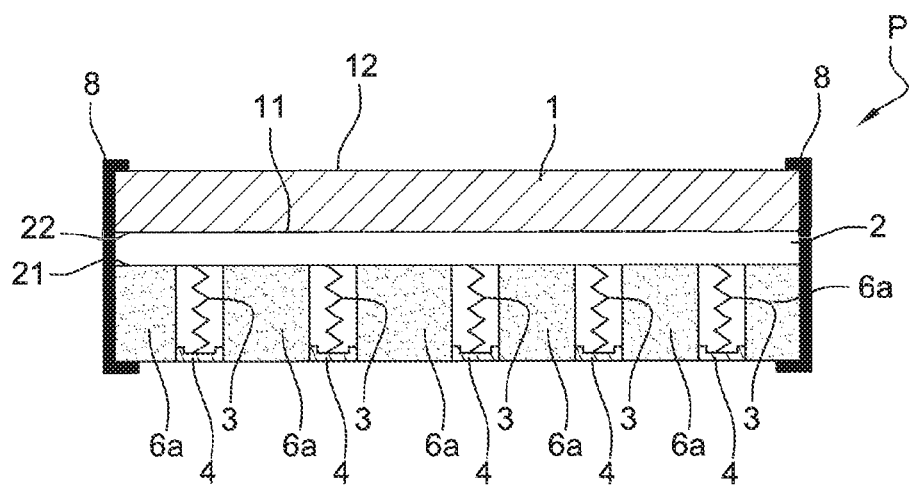
FIG. 12 is a diagrammatical view as a cross-section of an alternative of the hybrid solar panel, insulating elements being placed between the support elements.

In FIG. 12, the panel P comprises a thermally insulating element 6a that makes it possible to reduce the heat loss on the lower face 21 of the exchanger 2, in order to improve the recovery of the heat by said exchanger 2, and consequently increase the output of said panel P. The thermally insulating element 6a can, for example, have the form of a non-solid material such as glass wool or rock wool. In this case, the insulating element 6a is placed between the various support elements 4. It is maintained in position by a bottom plate (not shown) fixed to the profiles 4 and/or to the frame 8. This plate can, for example, be fixed to the profiles 4 and/or to the frame 8 using screws or bolts, adhesives, or by welding, gluing.

The insulating element 6a can also have the form of plates of solid material such as polystyrene, polyurethane, polyethylene, or polypropylene. These plates are arranged between the profiles 4 and can be partially slid under the frame 8 in such a way as to be maintained naturally in position. They can also be fastened on the lateral walls 42a, 42b of the profiles using means such as glue, or adhesives.

Embodiment No. 2

Figure 5:
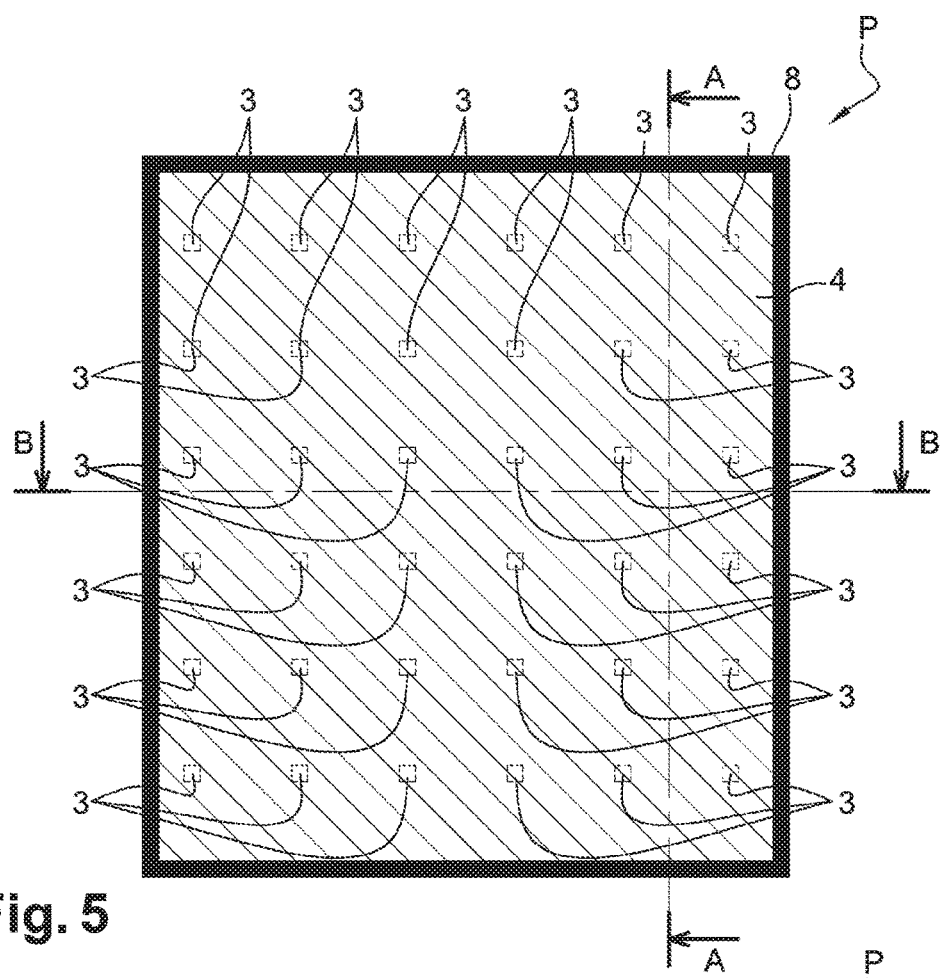
FIG. 5 is a diagrammatical view of the bottom of a hybrid solar panel in accordance with the invention, the bearing element having the form of a plate.
Figure 6A:
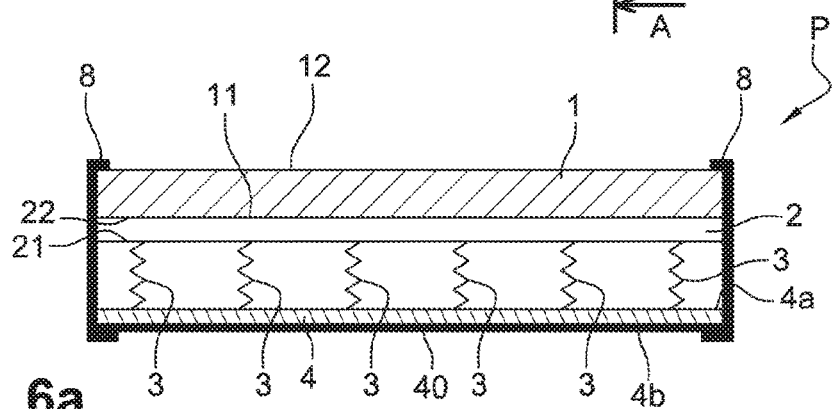
FIG. 6a is a cross-section view along B-B of the hybrid solar panel of the FIG. 5.
Figure 6B:
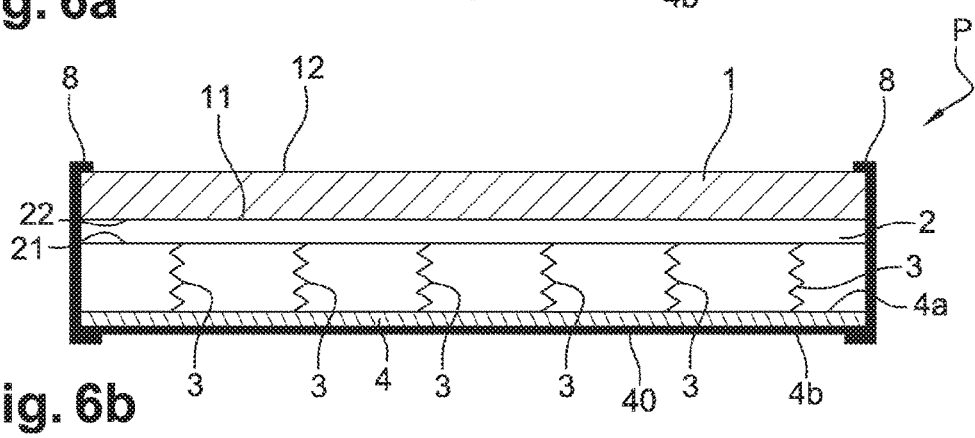
FIG. 6b is a cross-section view along A-A of the hybrid solar panel of the FIG. 5.

FIGS. 5, 6a and 6b describe a second embodiment wherein the bearing element 4 has the form of a plate. It is arranged under the exchanger 2 and preferable extends over the entire surface of the lower face 21 of said exchanger 2. This plate 4 is manufactured from a rigid material such as a polymer material (polystyrene, polyurethane, polyethylene, etc.) or a metal. The rear end 32 of the springs 3 bears on the upper face 41 of said plate 4 while their front end 31 is placed against the lower face 21 of the exchanger 2, as such making it possible to apply a compression force on the latter and to press it against the rear face 11 of the photovoltaic module 1. The plate 4 has dimensions in length and in width that are similar to those of the lower face 21 of the exchanger 2. It has a length between 150 cm and 400 cm and a width varying from 50 cm to 300 cm. Its thickness depends on the material used and is between 2 mm and 4 cm. In a manner equivalent to that described for the preceding embodiment, the thickness will depend on the sag of the panel P. It is chosen in such a way as to ensure that the lowest point is the return of the frame 8.

In the same way as in the first embodiment, the plate 4 is slid into the frame 8 in such a way as to be maintained in position. This plate 4 can be maintained solely on its lateral edges. It can, however, be maintained on longitudinal edges, or on its entire perimeter. It can also be made integral with the frame 8 using fastening means such as glue, adhesives, or screws or bolts. Such a configuration allows for at least one portion of the compression force exerted by the springs 3 on the plate 4, to be taken up by the frame 8. According to a preferred embodiment, the plate 4 is inserted into the frame 8, on lower wings 8a, and bears against the latter. As such, all or a portion of the compression force exerted by the elastic profiles 3 on the plate 4 is taken up by the frame 8 on lower wings 8a.

In a preferred embodiment, the plate 4 has a honeycomb structure. This type of plate makes it possible, in addition to further rigidifying the panel P, to not have to use additional insulation (described hereinabove in the description) since the plate with a honeycomb structure fulfils a dual function consisting in allowing the springs 3 to bear against and to insulate the solar panel P.

As described above in reference to embodiment no. 1, when the plate 4 is under stress and sags, said plate does not exceed the frame 8 and in particular does not exceed the plane 80 containing the lower face of said frame. For example, using a plate 4 with a honeycomb structure makes it possible to limit the sag of said plate.

The springs 3 used are the same as those described in the preceding embodiment. They are, preferably, uniformly distributed over the entire surface of the plate 4, but can optionally be placed randomly. As described for the preceding embodiment, a staggered arrangement contributes in reducing the sag of the exchanger 2, and consequently improves the homogeneity of the pressing of said exchanger 2 against the photovoltaic module 1.

This embodiment can, where applicable, comprise an additional thermally insulating element such as the one described for the preceding embodiment in order to reduce the heat loss on the exchanger 2. In the FIGS. 6a and 6b, the insulating element has the form of a plate 40 that is placed under the plate 4, and more particularly against its lower face 4b, in such a way as to improve the thermal insulation of the solar panel P. This insulating plate 40 is manufactured from a material that is similar to those described for the preceding embodiment. It can be, for example, fasted onto the plate 4 using means of fastening such as welding, or a gluing, or by using adhesives. It is present over the entire lower face 4a of the plate 4 with a length between 150 cm and 400 cm, a width varying from 50 cm to 300 cm. Its thickness is between 2 mm and 15 cm according to the material used.

As described above in reference to embodiment no. 1, use is advantageously made of a blocking element fixed to the exchanger 2 and in interaction with the plate 4 in order to block the exchanger 2 in translation in the direction of the length (longitudinal axis X) and of the width (transversal axis Y) of the panel P. This blocking element 5 is similar to the one described in FIG. 10 or 15.

Embodiment No. 3

Figure 7:
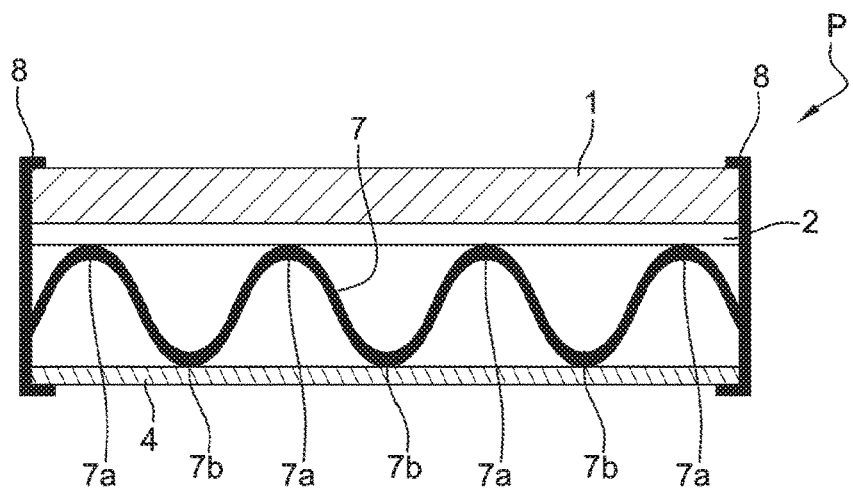
FIG. 7 diagrammatically shows as a cross-section of a hybrid solar panel in accordance with the invention.
Figure 8A:
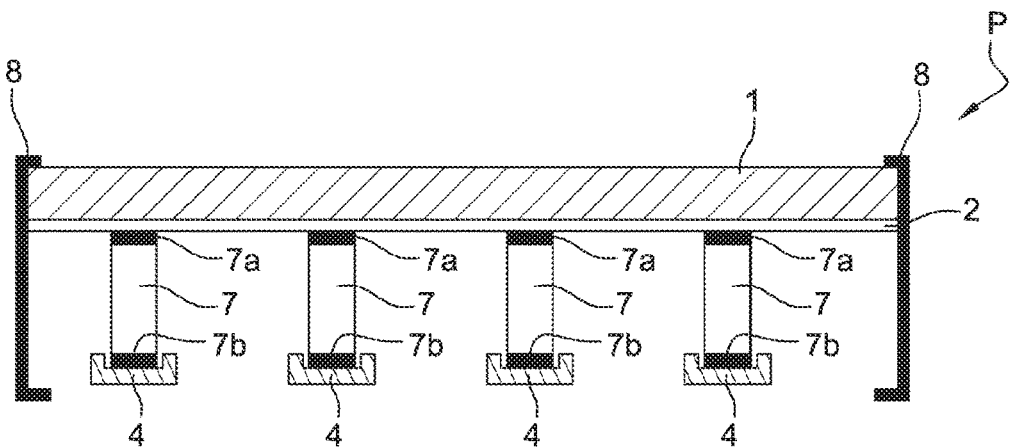
FIG. 8*a* is a cross-section view along A-A of the hybrid solar panel of the FIG. 7.

FIGS. 7 and 8a describe an additional embodiment equivalent to the embodiment no. 1 described hereinabove. The insertion of the support elements 4 into the frame 8 and using the blocking element 5 apply to this embodiment.

The springs 3 are replaced with a corrugated strip 7. This strip is manufactured in a semi-rigid material in such a way that it can substantially be deformed during the use of the solar panel P. This material can, for example, be polyethylene, polystyrene, polyurethane, etc.

As shown in FIG. 8a, each one of the corrugated strips 7 comprises corrugations that have high points 7a and low points 7b. The high points of the corrugated strip 7 are in contact with the lower face 21 of the exchanger 2 and make it possible to press the latter against the rear face 11 of the photovoltaic module 1. The corrugations serve as elastic elements 3 and make it possible to exert a compression force against the exchanger 2 at multiple points, as such improving the uniformity of the pressing. The low points 7b are pressing against the profiles 4. This configuration allows for a faster design of the panel since, instead of place of multiple springs, a single strip 7 is installed in each one of the profiles. In addition, using such a corrugated strip 7 prevents the deterioration of the lower face 21 of the exchanger that can occur during the use of springs. Additionally, the cost price of such a strip 7 is decreased in relation to the use of springs.

Embodiment No. 4

Figure 8B:
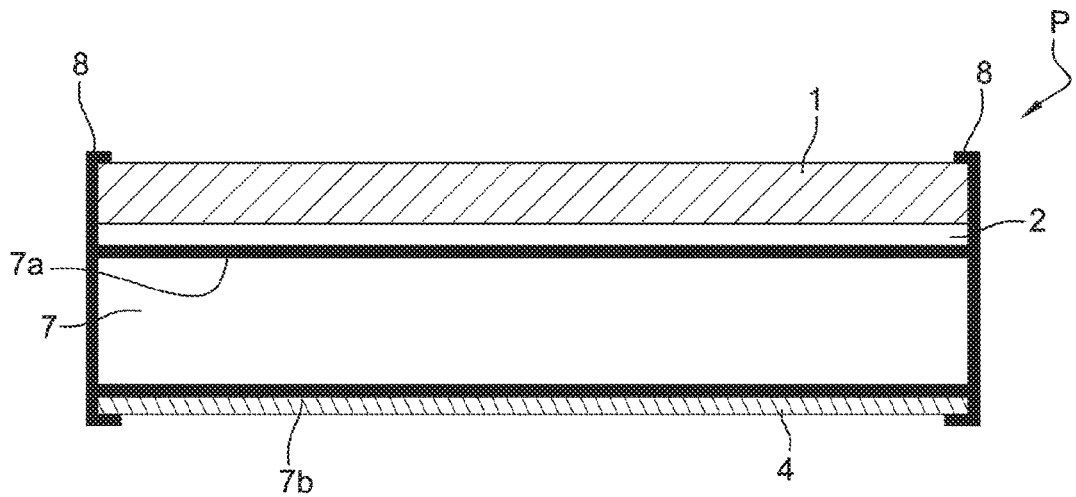
FIG. 8*b* is a cross-section view of an alternative of the hybrid solar panel of the FIG. 8*a*.

The FIG. 8b shows an alternative of embodiment no. 2 described hereinabove. The insertion of the plate 4 into the frame 8 and using the blocking element 5 apply to this embodiment.

The springs are replaced with at least one corrugated plate 7. This plate 7 can, as shown in FIG. 8b, extend over the entire lower face 21 of the exchanger 2. Alternatively, plates 7 of a more reduced size can be distributed homogeneously over their entire surface of the lower face 21. Preferably, they are installed at regular intervals, either over the entire length of the exchanger 2, or over the entire width thereof.

The corrugated plate 7 has dimensions that correspond to those of the exchanger 2. Its length varies from 150 cm to 400 cm and its width is between 5 cm and 300 cm. It has a thickness, depending on the material used, that can vary from 1 mm to 4 cm.

In the same way as for embodiment no. 3, the plate 7 comprises corrugations that have high points 7a and low points 7b. The high points of the corrugated plate 7 are in contact with the lower face 21 of the exchanger 2 and make it possible to press the latter against the rear face 11 of the photovoltaic module 1. The corrugations serve as elastic elements 3 and make it possible to exert a compression force against the exchanger 2 at multiple points, as such improving the uniformity of the pressing. The low points 7b are pressing against the plate 4.

In embodiments no. 1 and no. 2 comprising elastic elements 3 having the form of springs, the solar panel P can have means of protection 9a, 9b. These means of protection 9a, 9b are placed between the lower face 21 of the exchanger 2 and the front ends 32 of each one of the springs 3. These means of protection 9a, 9b make it possible to prevent the springs 3 from piercing the lower face 21 of the exchanger 2.

Figure 13A:
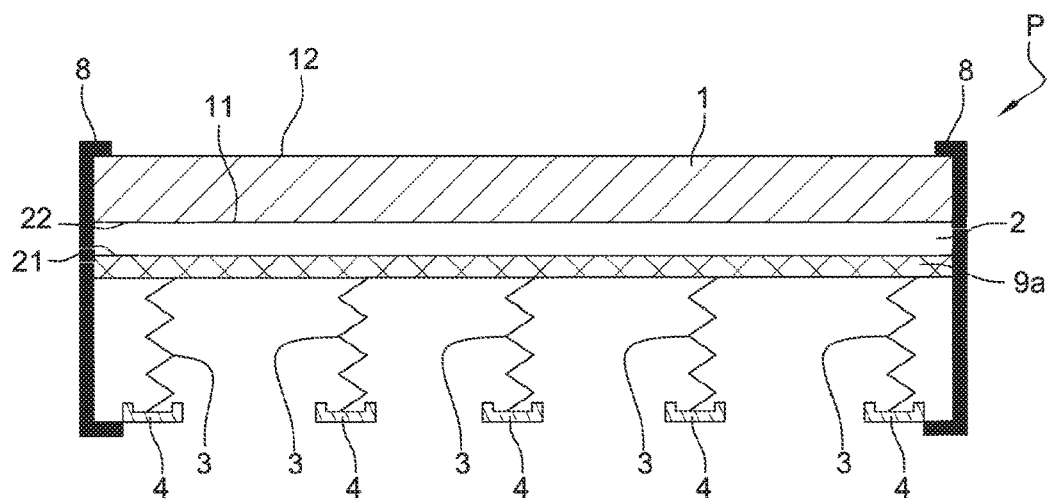
FIG. 13*a* is a diagrammatical view as a cross-section of an alternative of the hybrid solar panel, a protective plate being placed between the elastic profiles and the exchanger.
Figure 13B:
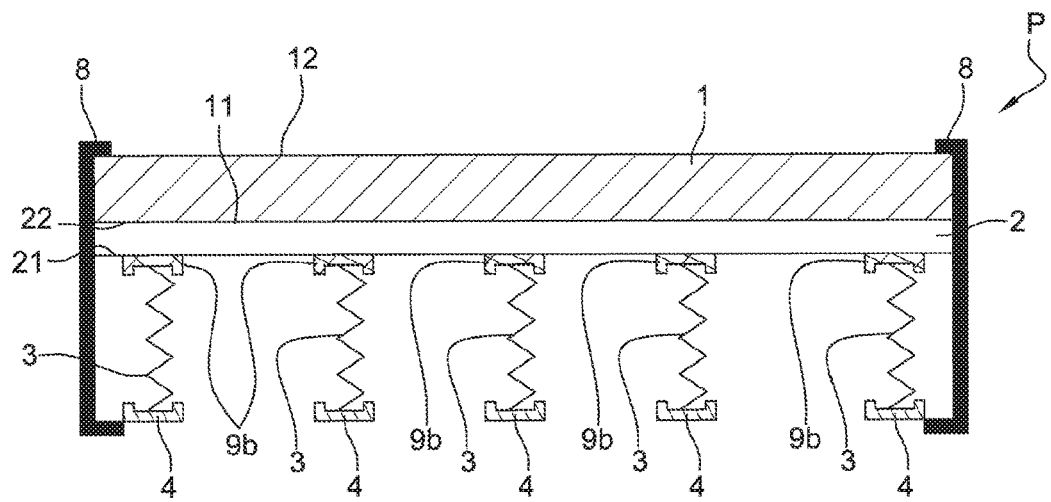
FIG. 13*b* is a diagrammatical view as a cross-section of an alternative of the hybrid solar panel, protective cups being placed between each elastic element and the exchanger.

These means of protection can have the form of a plate 9a that is positioned under the exchanger 2 (FIG. 13a). This plate 9a has dimensions that are similar to those of the exchanger 2 mentioned hereinabove. It can be manufactured from any type of material, such as for example steel, aluminum, or a plastic or a foam. These means of protection can also have the form of cups 9b (FIG. 13b) with a flat bottom. In the same way as the plate 9a, these cups 9b can be manufactured from any material. They have a diameter between 1 cm and 10 cm and a thickness, depending on the material used, varying from 1 mm to 1 cm. Alternatively, these means of protection can have the form of a cushion, such as for example elements made of foam, preferably foam cushions. The shape of the elements made of foam and/or of the cups can be varied, such as for example a square, a star, a circle, or a rectangle.

Figure 14:
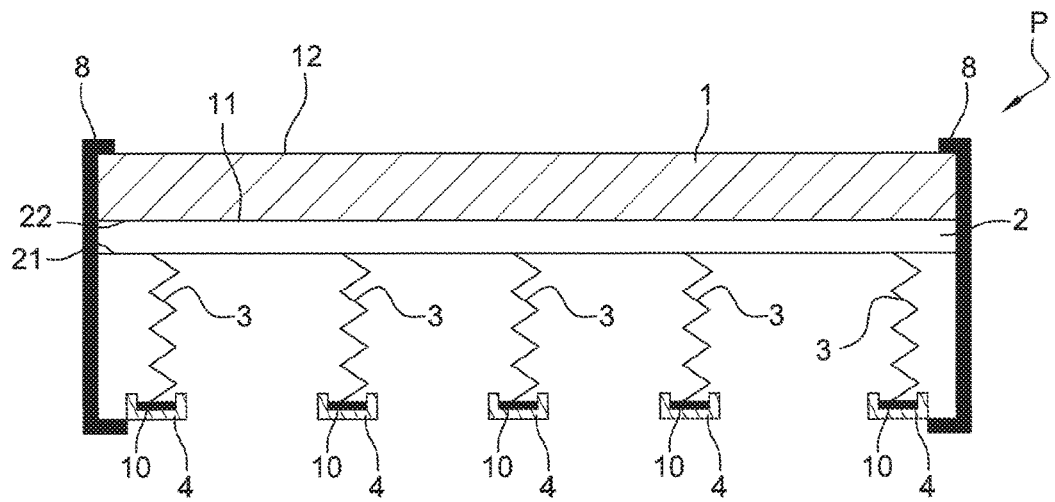
FIG. 14 is a diagrammatical view as a cross-section of an alternative of the hybrid solar panel, maintaining elements being placed between the support elements and the elastic profiles.

The arrangement of the various elements and/or means and/or steps of the invention, in the embodiments described hereinabove, must not be understood as requiring such an arrangement in all the implementations. In any case, it shall be understood that various modifications can be made to these elements and/or means and/or steps, without moving away from the spirit and the scope of the invention. In particular:

the heat exchanger 2 can be manufactured in a different material, such as for example metal (such as steel, stainless steel, aluminum, or copper), or from a composite material, a maintaining element 10 can be added between the elastic element 3 and the bearing element 4 (FIG. 14) in such a way as to maintain said elastic element 3 in position. It can have, for example, the form of an adhesive or have the form of a clip, the front end 32 of each one of the springs 3 can be ground in such a way as to not scratch or piece the lower face 21 of the exchanger 2, there may or may not be an additional plate between the photovoltaic module 1 and the exchanger 2, the plate 4 and the corrugated plate 7 can have dimensions that are different from those mentioned hereinabove, they can, for example, cover only half or one-third of the surface of the exchanger 2, the frequency of the corrugations of the plate and/or of the corrugated strip 7 can vary.

The invention claimed is:

1. Hybrid solar panel comprising:
a photovoltaic module comprising a front face and a rear face,
a heat exchanger comprising a lower face and an upper face, said upper face being arranged facing the rear face of the photovoltaic module,
a rigid frame surrounding the photovoltaic module and the heat exchanger,
at least one elastic element adapted to exert a compression force against the lower face of the exchanger in such a way that said exchanger is thrust against the rear face of the photovoltaic module,
the elastic element bears against at least one bearing element, said bearing element being in connection with the frame in such a way that at least one portion of the compression force exerted by the elastic element on the bearing element is taken up by said frame,
the bearing element is arranged under the exchanger and extends in the width and/or the length of said exchanger,
wherein the bearing element has the form of a U-shaped profile delimited by a bottom wall and two lateral branches, said branches define an opening on their free end, said profile is arranged in such a way that said opening is directed towards the lower face of the exchanger, the elastic element bearing against the bottom wall of said profile.

2. Hybrid solar panel according to claim 1, wherein the blocking element is positioned at the centre of the lower face of the exchanger.

3. Hybrid solar panel according to claim 1, wherein:
the frame has a lower face adapted for being positioned against a fastening support of the panel, and
the bearing element is configured in such a way that when said bearing element is stressed by the elastic element, it does not exceed the plane containing the lower face of said frame.

4. Hybrid solar panel according to claim 1, further comprising at least three support elements arranged under the exchanger and which each extend in the width of said exchanger, said support elements having the form of profiles installed at regular intervals in the length of said exchanger.

5. Hybrid solar panel according to claim 4, wherein several elastic elements are distributed in the length of each profile.

6. Hybrid solar panel according to claim 1, further comprising at least three support elements arranged under the exchanger and which each extend in the length of said exchanger, said support elements having the form of profiles installed at regular intervals in the width of said exchanger.

7. Hybrid solar panel according to claim 6, wherein several elastic elements are distributed in the length of each profile.

8. Hybrid solar panel according to claim 7, wherein the elastic elements are distributed in each one of the profiles in such a way that said elastic elements are arranged staggered in considering all of said profiles.

9. Hybrid solar panel according to claim 1, wherein the bearing element has the form of a plate arranged under the exchanger and which extends over the entire surface of the lower face of said exchanger.

10. Hybrid solar panel according to claim 9, wherein several elastic elements are distributed homogeneously over the entire surface of the lower face of the exchanger.

11. Hybrid solar panel according to claim 9, wherein the bearing element has a honeycomb structure.

12. Hybrid solar panel according to claim 11, wherein several elastic elements are distributed homogeneously over the entire surface of the lower face of the exchanger.

13. Hybrid solar panel according to claim 9, wherein the elastic elements are arranged staggered.

14. Hybrid solar panel according to claim 1, wherein each elastic element has the form of a helical compression spring.

15. Hybrid solar panel according to claim 1, further comprising a corrugated plate installed between the bearing element and the lower face of the exchanger, said corrugated plate being configured in such a way that its corrugations form the elastic elements.

16. Hybrid solar panel according to claim 1, wherein the elastic element is made from plastic, or from galvanized steel, or from stainless steel.

17. Hybrid solar panel according to claim 1, wherein the elastic element comprises a front end and a rear end, a means of protection being placed between the lower face of the exchanger and said front end.

18. Hybrid solar panel according to claim 17, wherein the means of protection has the form of a rigid plate installed between the lower face of the exchanger and the front end of the elastic element.

19. Hybrid solar panel according to claim 17, wherein the means of protection has the form of a cup placed between the lower face of the exchanger and the front end of the elastic element.

20. Hybrid solar panel according to claim 17, wherein the means of protection has the form of an element made from foam placed between the lower face of the exchanger and the front end of the elastic element.

21. Hybrid solar panel according to claim 1, wherein a maintaining element is placed between the rear end of the elastic element and the bearing element.

22. Hybrid solar panel according to claim 21, wherein the maintaining element is an adhesive element.

23. Hybrid solar panel according to claim 1, wherein a thermally insulating element is inserted between the support elements.

* * * * *